(12) United States Patent
Ikeda et al.

(10) Patent No.: US 9,281,154 B2
(45) Date of Patent: Mar. 8, 2016

(54) MICROWAVE INTRODUCING MECHANISM, MICROWAVE PLASMA SOURCE AND MICROWAVE PLASMA PROCESSING APPARATUS

(71) Applicant: TOKYO ELECTRON LIMITED, Minato-ku (JP)

(72) Inventors: Taro Ikeda, Yamanashi (JP); Yuki Osada, Yamanashi (JP); Shigeru Kasai, Yamanashi (JP); Hiroyuki Miyashita, Yamanashi (JP)

(73) Assignee: TOKYO ELECTRON LIMITED, Minato-ku (JP)

( * ) Notice: Subject to any disclaimer, the term of this patent is extended or adjusted under 35 U.S.C. 154(b) by 402 days.

(21) Appl. No.: 13/789,115

(22) Filed: Mar. 7, 2013

(65) Prior Publication Data

US 2013/0180661 A1    Jul. 18, 2013

Related U.S. Application Data

(63) Continuation of application No. PCT/JP2011/069140, filed on Aug. 25, 2011.

(30) Foreign Application Priority Data

Sep. 9, 2010  (JP) ................... 2010-201970
Mar. 16, 2011  (JP) ................... 2011-058407

(51) Int. Cl.
  *C23C 16/00*  (2006.01)
  *C23F 1/00*  (2006.01)
  (Continued)

(52) U.S. Cl.
  CPC ......... *H01J 23/005* (2013.01); *C23C 16/45565* (2013.01); *C23C 16/511* (2013.01); *H01J 37/3222* (2013.01); *H01J 37/32256* (2013.01); *H05H 1/46* (2013.01); *H05H 2001/463* (2013.01)

(58) Field of Classification Search
  CPC ............. C23C 16/45565; C23C 16/511; H01J 37/3222; H01J 37/32192; H01J 37/32256; H01J 23/005; H01J 37/32229; H01J 37/32266; H05H 1/46; H05H 2001/463
  USPC .......................... 156/345.35, 345.36, 345.41; 118/723 MW, 723 ME
  See application file for complete search history.

(56) References Cited

U.S. PATENT DOCUMENTS 4,866,346 A * 9/1989 Gaudreau et al. ......... 315/111.21
5,234,565 A * 8/1993 Yoshida .................... 204/298.38
(Continued)

FOREIGN PATENT DOCUMENTS

JP  2003-347808  12/2003
JP  2007-109457  4/2007
(Continued)

OTHER PUBLICATIONS

International Search Report issued on Nov. 15, 2011 for PCT/JP2011/069140 filed on Aug. 25, 2011 with English Translation.
(Continued)

*Primary Examiner* — Rakesh Dhingra
(74) *Attorney, Agent, or Firm* — Oblon, McClelland, Maier & Neustadt, L.L.P.

(57) ABSTRACT

The microwave introducing mechanism includes an antenna unit having a planar antenna radiating a microwave into a chamber; a tuner for performing impedance matching; and a heat dissipation device for dissipating a heat from the antenna unit. The tuner has a tuner main body including a tubular outer conductor and a tubular inner conductor to serve as a part of a microwave transmission line; slugs provided between the outer conductor and the inner conductor to be movable along a longitudinal direction of the inner conductor; and a driving device for moving the slugs. The heat dissipation device has a heat pipe configured to transfer the heat of the antenna unit from its heat input end to its heat dissipation end.

17 Claims, 14 Drawing Sheets

(51) Int. Cl.
*H01L 21/306* (2006.01)
*H01J 23/00* (2006.01)
*C23C 16/455* (2006.01)
*C23C 16/511* (2006.01)
*H01J 37/32* (2006.01)
*H05H 1/46* (2006.01)

(56) References Cited

U.S. PATENT DOCUMENTS 5,665,640 A * 9/1997 Foster et al. ............ 438/680
6,856,211 B2   2/2005 Yamada et al.
2009/0159214 A1   6/2009 Kasai
2011/0018651 A1   1/2011 Ikeda et al.

FOREIGN PATENT DOCUMENTS

| | | |
|---|---|---|
| JP | 2009-230915 | 10/2009 |
| JP | 2010-121193 | 6/2010 |
| KR | 10-2009-0127219 | 12/2009 |
| WO | 2008/013112 | 1/2008 |

OTHER PUBLICATIONS

Office Action issued Jun. 10, 2014 in Korean Patent Application No. 10-2013-7007756.

* cited by examiner

MICROWAVE INTRODUCING MECHANISM, MICROWAVE PLASMA SOURCE AND MICROWAVE PLASMA PROCESSING APPARATUS

This application is a Continuation Application of PCT International Application No. PCT/JP2011/069140 filed on Aug. 25, 2011, which designated the United States.

FIELD OF THE INVENTION

The present invention relates to a microwave introducing mechanism that introduces a microwave into a chamber in which a plasma process is performed, and a microwave plasma source and a microwave plasma processing apparatus using the same.

BACKGROUND OF THE INVENTION

In a manufacturing process of a semiconductor device or a liquid crystal display, a plasma processing apparatus such as a plasma etching apparatus, a plasma CVD film forming apparatus, or the like is used to perform a plasma process such as an etching process, a film forming process, or the like on a target substrate to be processed such as a semiconductor wafer, a glass substrate, or the like.

Recently, for the plasma processing apparatus, some attention has been paid to an RLSA™ microwave plasma processing apparatus capable of uniformly generating a high density plasma having a low electron temperature (see, e.g., Japanese Patent Application Publication No. 2007-109457).

The RLSA™ microwave plasma processing apparatus includes a planar antenna (a radial line slot antenna) provided above a chamber, the planar antenna having a plurality of slots formed in a predetermined pattern. Microwaves from a microwave generating source are radiated through the slots of the planar antenna into a vacuum-sealed chamber via a microwave transmitting plate made of a dielectric. A thus-generated microwave electric field turns a gas, introduced into the chamber, into a plasma, by which a plasma process is performed on a target substrate such as a semi-conductor wafer or the like.

In addition, there has been proposed a microwave plasma processing apparatus including a microwave plasma source in which a plurality of microwaves is distributed and guided into a chamber via a plurality of antenna modules having the planar antenna, and the microwaves are spatially combined in the chamber (see, e.g., International Patent Publication No. 2008/013112).

In such a type of microwave plasma processing apparatus, an impedance matching unit (tuner) is needed to perform impedance tuning of the load (plasma). Such impedance matching unit is known to use a slug tuner that has a plurality of slugs (see, e.g., Japanese Patent Application Publication No. 2003-347808).

The slug tuner includes a coaxial microwave transmission line formed of an outer conductor and an inner conductor provided within the outer conductor; a slug, formed of at least two dielectric bodies, provided in the gap, between the inside of the outer conductor and the outside of the inner conductor, which can freely move along a longitudinal direction of the inner conductor; and a driving unit for moving these slugs to perform impedance tuning. Thus, a compact and low loss tuner can be realized.

However, in such a microwave plasma source, if a microwave power applied is increased, the temperature of an antenna and/or a microwave transmitting plate rises due to the heat transferred from the plasma and the heat caused by microwave loss. These heats may have an undesirable impact on the mobility of the slugs in a slug tuner.

SUMMARY OF THE INVENTION

In view of the above, the present invention provides a microwave introducing mechanism, a microwave plasma source and a microwave plasma processing apparatus, which can suppress the heat effects on the mobility of the slugs.

In accordance with a first aspect of the present invention, there is provided a microwave introducing mechanism, provided in a microwave transmission line through which a microwave outputted from a microwave output unit of a microwave plasma source is transmitted, for introducing the microwave into a chamber, the microwave plasma source being configured to generate a microwave plasma in the chamber, the mechanism includes: an antenna unit including a planar antenna configured to radiate the microwave into the chamber through the microwave transmission line; a tuner provided in the microwave transmission line to adjust an impedance of the microwave transmission line; and a heat dissipation device configured to dissipate a heat from the antenna unit, wherein the tuner includes: a tuner main body having a tubular outer conductor and a tubular inner conductor coaxially provided in the outer conductor, the tuner main body serving as a part of the microwave transmission line; a slug provided between the outer conductor and the inner conductor to be movable along a longitudinal direction of the inner conductor, the slug having an annular shape and being made of a dielectric material; and a driving device configured to move the slug, and wherein the heat dissipation device includes: a heat pipe, having a heat input end and a heat dissipation end, configured to transfer the heat of the antenna unit from the heat input end to the heat dissipation end by disposing the heat input end in the antenna unit; and a heat dissipation unit provided at the heat dissipation end of the heat pipe to dissipate the heat transferred to the heat dissipation end.

The heat pipe may be provided in the inner conductor, and the heat dissipation unit may be formed of a heat sink or a cooling member.

The driving device may include: a driving unit configured to supply a driving force; a driving delivery unit configured to deliver the driving force supplied from the driving unit to the slug; a driving guide unit configured to guide a movement of the slug; and a supporting unit configured to support the slug in the driving delivery unit, wherein the driving delivery unit, the driving guide unit and the supporting unit are accommodated inside the inner conductor.

In this case, in the driving device, the driving delivery unit may employ a screw mechanism including a sliding member having a screw hole and a slug moving shaft formed of a screw bar which is extended inside the inner conductor in a longitudinal direction thereof and is screwed into the screw hole of the sliding member, the sliding member being inserted into the slug and sliding along the inside of the inner conductor while being brought into contact with an inner circumference surface of the inner conductor; the driving guide unit serves as a sliding guide mechanism which is formed by the sliding member and the inner circumference surface of the inner conductor; the supporting unit is formed of the sliding member; and the driving unit has a motor rotating the slug moving shaft, the driving unit rotating the slug moving shaft by using the motor to drive the slug in a state where the sliding member slides along the inner circumference surface of the inner conductor. The sliding member may be made of a resin having a sliding characteristic.

The sliding member may be fixed to the slug by using a fixing screw. Threads may not be formed at a portion corresponding to an area, in the screw hole of the sliding member, pressed by the fixing screw. The sliding member may have protrusions at outer peripheries of opposite ends thereof and be fixed to the slug by the protrusions press-fitted into the slug, and threads may not be formed at portions, in the screw hole of the sliding member, corresponding to the protrusions.

In accordance with a second aspect of the present invention, there is provided a microwave plasma source which converts a gas supplied into a chamber to a plasma by introducing a microwave into the chamber, including a microwave output unit configured to output a microwave; a microwave transmission line through which the outputted microwave is transmitted; and a microwave introducing mechanism provided in the microwave transmission line to introduce the transmitted microwave into the chamber, wherein the microwave introducing mechanism includes: an antenna unit including a planar antenna configured to radiate the microwave into the chamber through the microwave transmission line; a tuner provided in the microwave transmission line to adjust an impedance of the microwave transmission line; and a heat dissipation device configured to dissipate a heat from the antenna unit, wherein the tuner has: a tuner main body including a tubular outer conductor and a tubular inner conductor coaxially provided in the outer conductor, the tuner main body serving as a part of the microwave transmission line; a slug provided between the outer conductor and the inner conductor to be movable along a longitudinal direction of the inner conductor, the slug having an annular shape and being made of a dielectric material; and a driving device configured to move the slug, and wherein the heat dissipation device has: a heat pipe, having a heat input end and a heat dissipation end, configured to transfer the heat of the antenna unit from the heat input end to the heat dissipation end by disposing the heat input end in the antenna unit; and a heat dissipation unit provided at the heat dissipation end of the heat pipe to dissipate the heat transferred to the heat dissipation end.

In accordance with a third aspect of the present invention, there is provided a plasma processing apparatus which performs a plasma process on a target substrate accommodated in a chamber; a gas supply mechanism configured to supply a gas into the chamber; and a microwave plasma source configured to convert the gas supplied into the chamber to a plasma by introducing a microwave into the chamber, the microwave plasma source including: a microwave generating mechanism configured to generate a microwave; a microwave transmission line through which the generated microwave is transmitted; and a microwave introducing mechanism provided in the microwave transmission line to introduce the transmitted microwave into the chamber, wherein the microwave introducing mechanism includes: an antenna unit including a planar antenna configured to radiate the microwave into the chamber through the microwave transmission line; a tuner provided in the microwave transmission line to adjust an impedance of the microwave transmission line; and a heat dissipation device configured to dissipate a heat from the antenna unit, wherein the tuner has: a tuner main body including a tubular outer conductor and a tubular inner conductor coaxially provided in the outer conductor, the tuner main body serving as a part of the microwave transmission line; a slug provided between the outer conductor and the inner conductor to be movable along a longitudinal direction of the inner conductor, the slug having an annular shape and being made of a dielectric material; and a driving device configured to move the slug, and wherein the heat dissipation device has: a heat pipe, having a heat input end and a heat dissipation end, configured to transfer the heat out of the antenna unit from the heat input end to the heat dissipation end by disposing the heat input end in the antenna unit; and a heat dissipation unit provided at the heat dissipation end of the heat pipe to dissipate the heat transferred to the heat dissipation end.

DETAILED DESCRIPTION OF THE EMBODIMENTS

Figure 1:
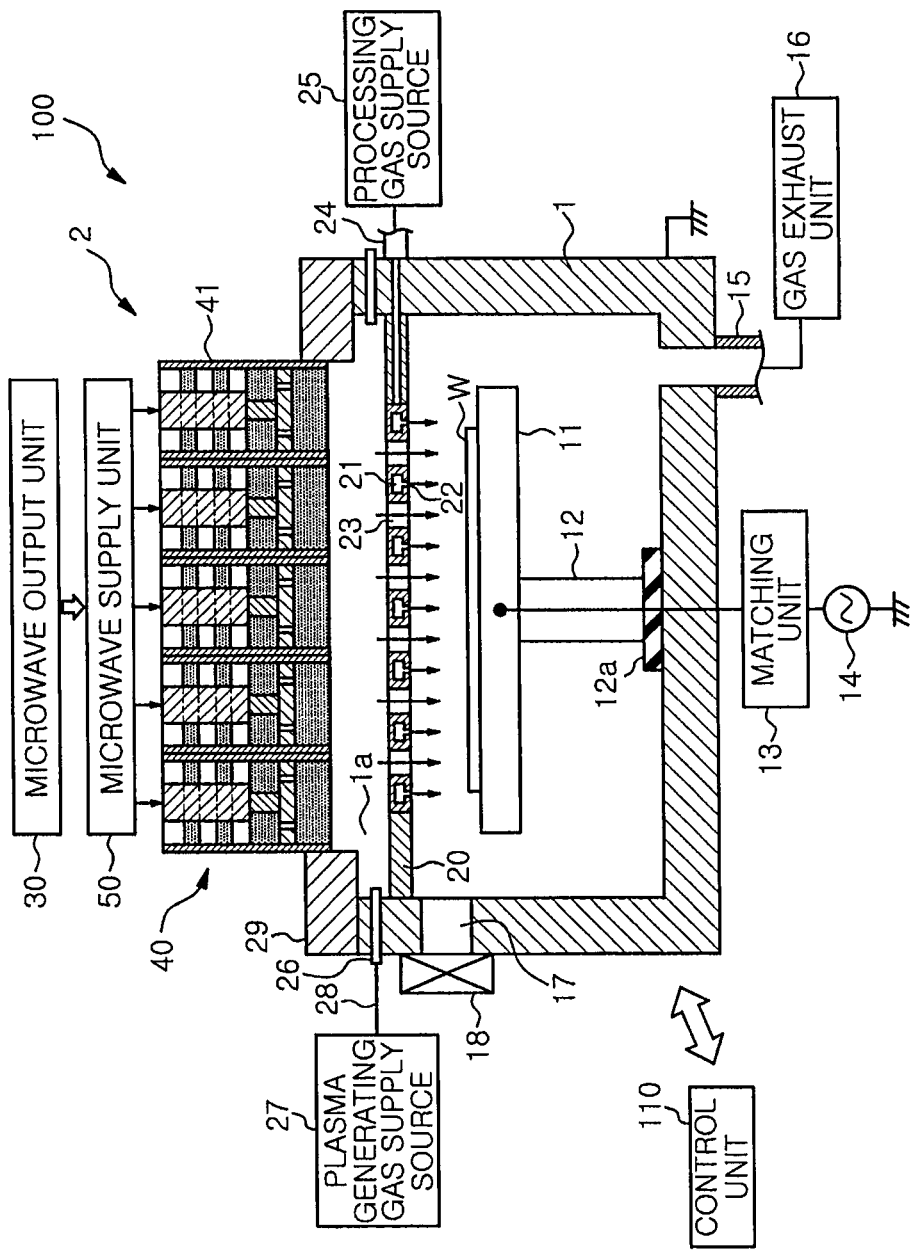
FIG. 1 is a cross-sectional view showing a schematic configuration of a plasma processing apparatus on which a microwave plasma source including a microwave introducing mechanism is mounted in accordance with an embodiment of the present invention.
Figure 2:
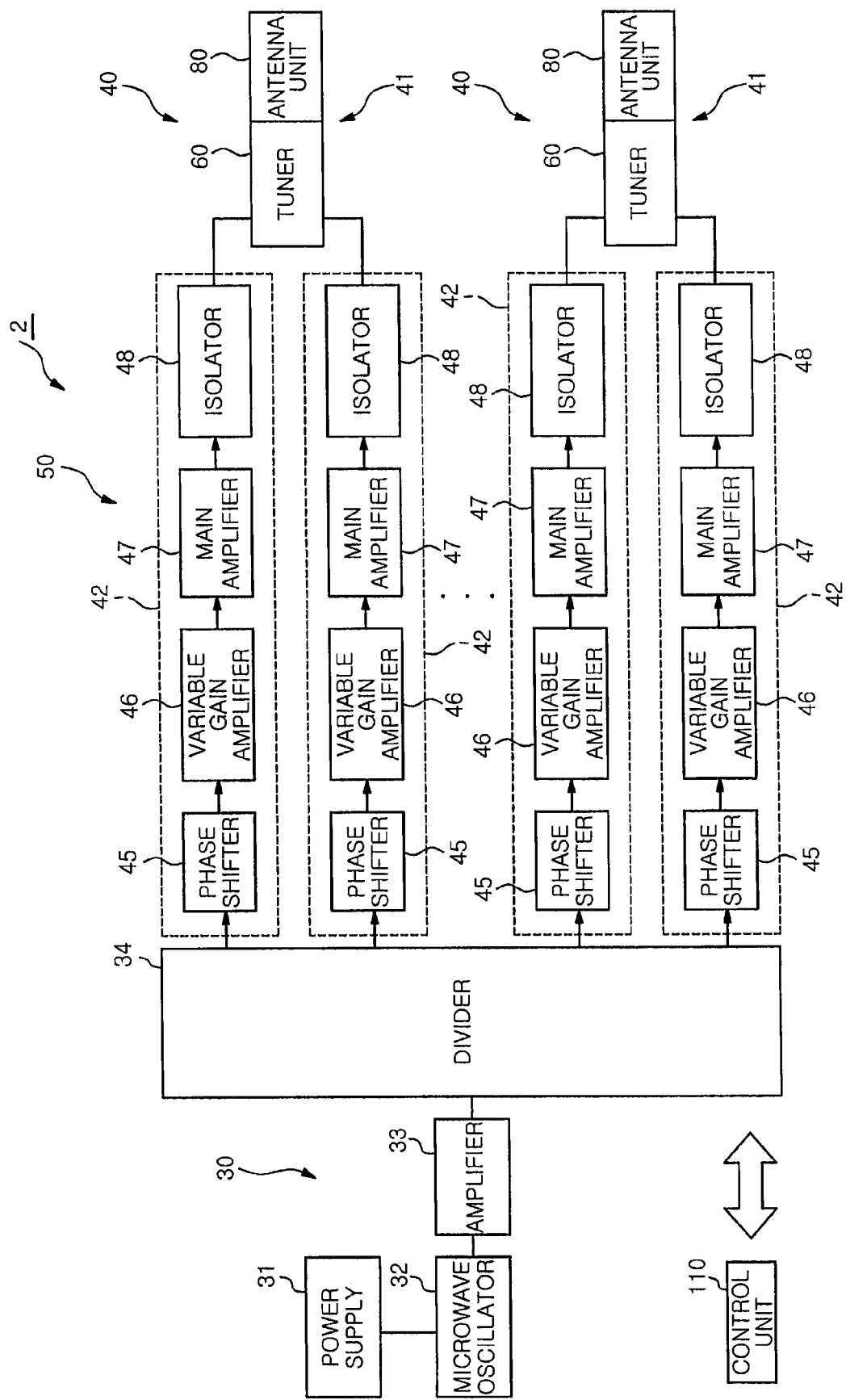
FIG. 2 is a schematic view showing a configuration of the microwave plasma source of FIG. 1.

Hereinafter, embodiments of the present invention will be described in detail with reference to the accompanying drawings. FIG. 1 is a cross-sectional view showing a schematic configuration of a plasma processing apparatus on which a microwave plasma source including a microwave introducing mechanism is mounted in accordance with an embodiment of the present invention. FIG. 2 is a schematic view showing a configuration of the microwave plasma source of FIG. 1.

A plasma processing apparatus 100 is configured as, e.g., a plasma etching apparatus for performing on a wafer W an etching process as a plasma process. The plasma processing apparatus 100 includes a substantially cylindrical airtight chamber 1 made of a metal such as aluminum, stainless steel, or the like, the chamber 1 being grounded; and a microwave plasma source 2 for forming a microwave plasma within the chamber 1. An opening 1a is formed at an upper portion of the chamber 1, and the microwave plasma source 2 is disposed to face the inside of the chamber 1 through the opening 1a.

Within the chamber 1, a susceptor 11, for horizontally supporting a wafer W as a target object to be processed, is supported by a cylindrical support member 12 extending upwardly from an insulating member 12a on a bottom center of the chamber 1. The susceptor 11 and the support member 12 may be made of, e.g., aluminum having an alumite-processed (anodically oxidized) surface.

Although they are not illustrated, the susceptor 11 is provided with an electrostatic chuck for electrostatically attracting the wafer W; a temperature control mechanism; a gas channel for supplying a heat transfer gas to a bottom surface of the wafer W; elevation pins which are raised and lowered to transfer the wafer W; and the like. A high frequency bias power supply 14 is electrically connected to the susceptor 11 via a matching unit 13. By supplying a high frequency power from the high frequency bias power supply 14 to the susceptor 11, ions in the plasma are attracted toward the wafer W.

A gas exhaust line 15 is connected to a bottom portion of the chamber 1 and a gas exhaust unit 16 including a vacuum pump (not shown) is connected to the gas exhaust line 15. By operating the gas exhaust unit 16, the chamber 1 can be exhausted and depressurized to a predetermined vacuum level at a high speed. Provided at a sidewall of the chamber 1, are a loading/unloading port 17 for loading and unloading the wafer W and a gate valve 18 for opening and closing the loading/unloading port 17.

A shower plate 20 for injecting a processing gas, e.g., a plasma etching gas, toward the wafer W is horizontally provided above the susceptor 11 in the chamber 1. The shower plate 20 has lattice-shaped gas channels 21 and a plurality of gas injection holes 22 formed at the gas channels 21. Space portions 23 are defined between the lattice-shaped gas channels 21. A line 24 extending to the outside of the chamber 1 is connected to the gas channels 21 of the shower plate 20, and a processing gas supply source 25 is connected to the line 24.

Meanwhile, a ring-shaped plasma generating gas introducing member 26 is provided above the shower plate 20 of the chamber 1 along the wall of the chamber, and a plurality of gas injection holes are formed in an inner circumferential portion of the plasma generating gas introducing member 26. A plasma generating gas supply source 27, for supplying a plasma generating gas, is connected to the plasma generating gas introducing member 26 via a line 28. As for the plasma gas, Ar gas or the like is preferably used.

The plasma generating gas introduced into the chamber from the plasma generating gas introducing member 26 is turned into a plasma by the microwave introduced into the chamber 1 from the microwave plasma source 2. The thus generated plasma, e.g., Ar plasma passes through the space portions 23 of the shower plate 20 and excites a processing gas injected through the gas injection holes 22 of the shower plate 20 to thereby generate a plasma of the processing gas.

The microwave plasma source 2 is held by a support ring 29 provided at an upper portion of the chamber 1 and the space therebetween is sealed airtight. As shown in FIG. 2, the microwave plasma source 2 includes a microwave output unit 30 for dividedly outputting microwaves through a plurality of channels; a microwave introduction unit 40 for guiding microwaves to the chamber 1; and a microwave supply unit 50 for supplying, to the microwave introduction unit 40, microwaves outputted from the microwave output unit 30. The microwaves outputted from the microwave output unit 30 are transmitted to the chamber 1 through a microwave transmission line via the microwave supply unit 50 and the microwave introduction unit 40.

The microwave output unit 30 includes a power supply 31; a microwave oscillator 32; an amplifier 33 for amplifying an oscillated microwave; and a divider 34 for dividing the amplified microwave into a plurality of microwaves.

The microwave oscillator 32 performs, e.g., PLL (Phase Locked Loop) oscillation for a microwave of a predetermined frequency (e.g., 2.45 GHz). The divider 34 divides the microwave amplified by the amplifier 33 while matching the impedance between an input side and an output side such that the loss of the microwave can be minimized. The frequency of the microwave may be 8.35 GHz, 5.8 GHz, 1.98 GHz, or the like, in addition to 2.45 GHz.

The microwave supply unit 50 includes a plurality of amplifier sections 42 for mainly amplifying the microwaves divided by the divider 34. Each of the amplifier sections includes a phase shifter 45; a variable gain amplifier 46; a main amplifier 47 included in a solid state amplifier; and an isolator 48.

The phase shifter 45 is configured to shift a phase of the microwave by a slug tuner 60, and the radiation characteristics can be modulated by adjusting the phase. For example, the phase in each of antenna modules is adjusted to control its direction, thereby changing the plasma distribution. As another example, circularly polarized waves can be obtained by shifting the phase by about 90° between adjacent antenna modules. Further, the phase shifter 45 can be used to control the delay characteristics between components in the amplifier and to perform spatial combinations in the tuner. However, the phase shifter 45 need not be provided when it is unnecessary to modulate the radiation characteristics or to control the delay characteristics between the components in the amplifier.

The variable gain amplifier 46 serves to control power levels of the microwaves to be inputted to the main amplifier 47. Further, the variable gain amplifier 46 serves to adjust a variation in each of the antenna modules or to adjust an intensity of the plasma. By controlling the variable gain amplifier 46 for each of the antenna modules, it is possible to variably adjust the distribution of the generated plasma.

The main amplifier 47 included in the solid state amplifier may contain, e.g., an input matching circuit; a semiconductor amplifying device; an output matching circuit; and a high Q resonant circuit.

The isolator 48 serves to separate the microwaves reflected by the microwave introduction unit 40 toward the main amplifier 47 and has a circulator and a dummy load (coaxial terminator). The circulator guides the microwave reflected by an antenna unit 80, which will be described later, to the dummy load, and the dummy load converts the reflected microwave guided by the circulator into heat.

The microwave introduction unit 40, as shown in FIG. 2, includes a plurality of microwave introducing mechanisms 41. Microwave powers are supplied from two corresponding amplifier sections 42 to each of the microwave introducing mechanisms 41. Each of the microwave introducing mechanisms 41 combines the supplied microwave powers and radiates the combined microwave power into the chamber 1.

Figure 3:
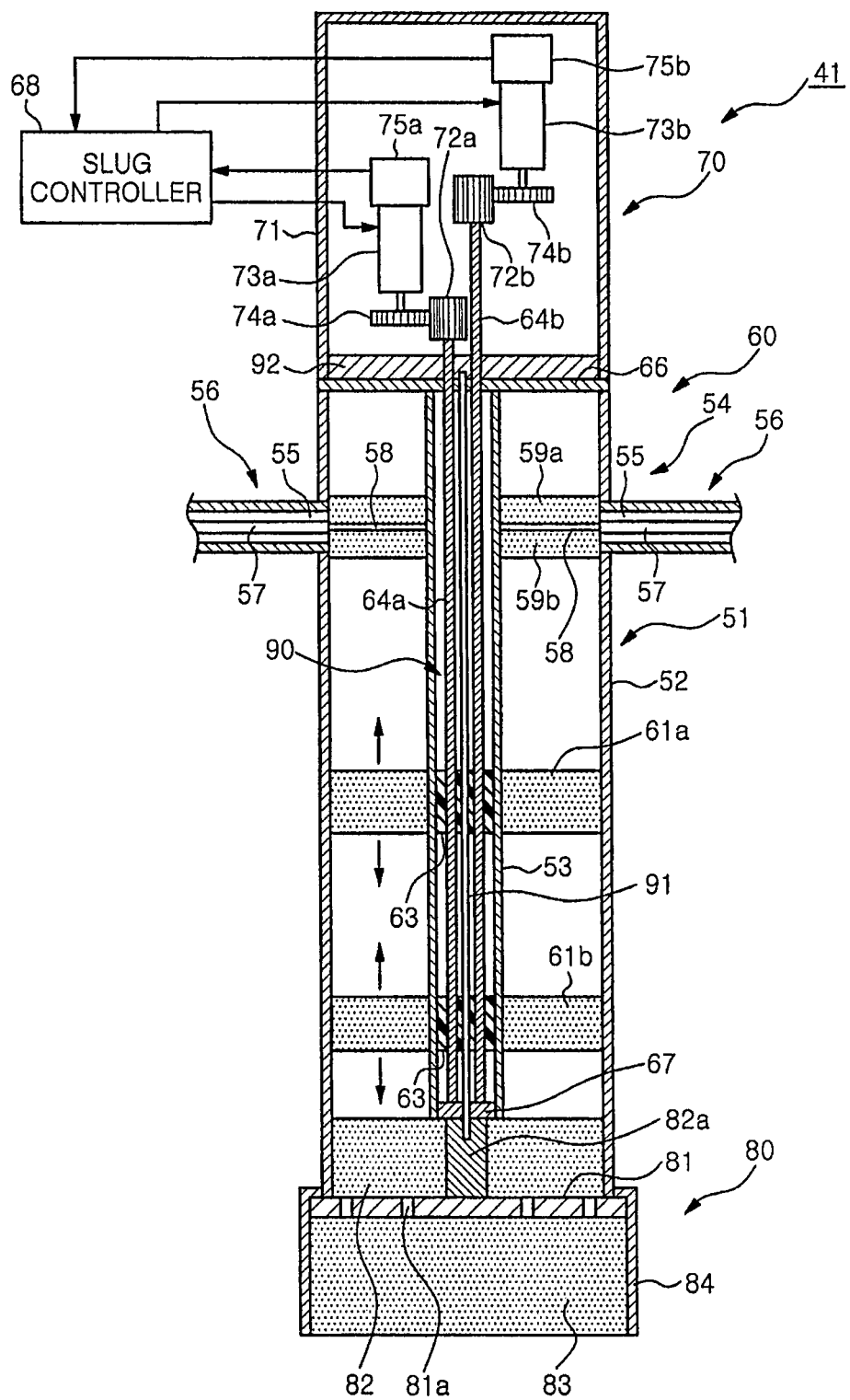
FIG. 3 is a vertical cross-sectional view showing the microwave introducing mechanism in accordance with the embodiment of the present invention.

FIG. 3 is a vertical cross-sectional view showing one microwave introducing mechanism 41. As shown in FIG. 3, the microwave introducing mechanism 41 includes a tuner 60 and an antenna unit 80, which are integrally formed. The microwave introducing mechanism 41 also includes a heat dissipation device 90 for dissipating the heat from the antenna unit 80. The tuner 60 adjusts the impedance of the microwave transmission line to thereby match the impedance of the plasma load in the chamber 1 with the characteristic impedance of the microwave power in the microwave output unit 30.

The tuner 60 includes a tuner main body 51 serving as a part of the microwave transmission line, the tuner main body 51 having a tubular outer conductor 52 and a tubular inner conductor 53 which is coaxially provided inside the outer conductor 52. In addition, a base end of the tuner main body 51 serves as a power combining unit 54. The tuner 60 also includes a slug driving unit 70, which is provided on top of the power combining unit 54.

For introducing microwave power, the power combining unit 54 includes two microwave power introduction ports 55 provided at the respective sides of the outer conductor 52. To supply microwaves amplified from the amplifier section 42, a coaxial cable 56 is connected to the microwave power introduction ports 55. Also, a power supply antenna 58 extending horizontally towards the inside of the outer conductor 52 of the tuner main body 51 is connected to a leading end of an inner conductor 57 of the coaxial cable 56. The power supply antenna 58 is inserted between an upper and a lower dielectric member 59a and 59b, each of which is made of a dielectric material such as quartz or the like. By radiating microwaves (electromagnetic waves) from two of the power supply antennas 58, microwave powers are supplied to the space between the inner conductor 53 and the outer conductor 52 and the microwave powers are combined. The microwave powers spatially combined in the power combining unit 54 propagate towards the antenna unit 80.

Between the power combining unit 54 of the tuner main body 51 and the antenna unit 80, two annular-shaped slugs 61a and 61b, made of a dielectric material, are arranged to be movable up and down between the outer conductor 52 and the inner conductor 53. The slug 61a is provided at a side of the slug driving unit 70 and the slug 61b is provided at a side of the antenna unit 80. Also, within the inner conductor 53, two slug moving shafts 64a and 64b are provided along the direction of its length (vertical direction), the two slug moving shafts 64a and 64b being formed of screw rods formed with, e.g., trapezoidal threads.

Figure 4:
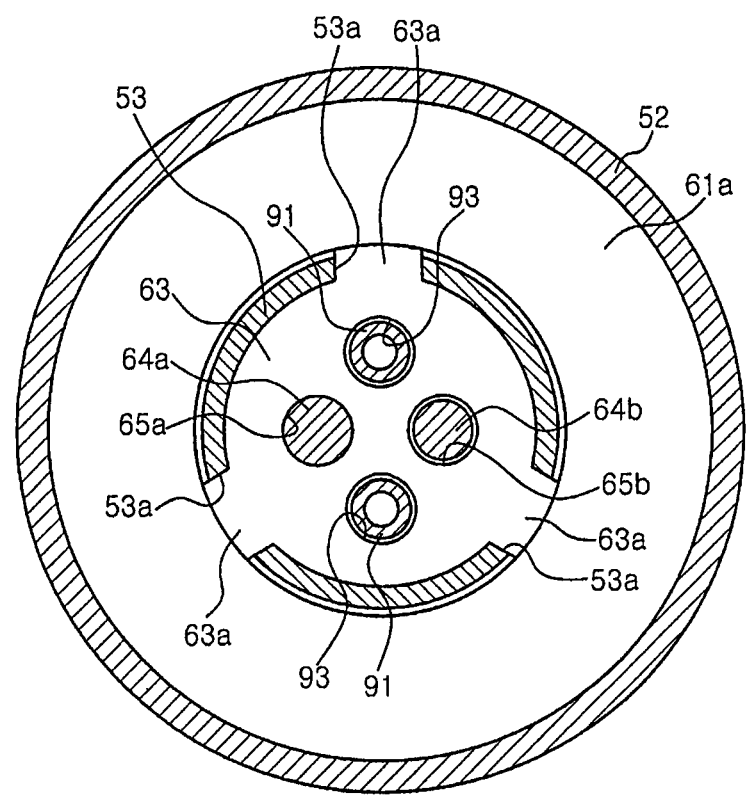
FIG. 4 is a horizontal cross-sectional view showing a slug and a sliding member in the main body of a tuner.

A sliding member 63 made of resin with a sliding characteristic is inserted and fixed inside of the slugs 61a and 61b. As shown in FIG. 4, a screw hole 65a, to which the slug moving shaft 64a is screw-coupled, and a through hole 65b, through which the slug moving shaft 64b is inserted, are formed in the sliding member 63 inserted into the slug 61a. Similarly, the screw hole 65a and the through hole 65b are formed in the sliding member 63 inserted into the slug 61b. However, the slug moving shaft 64b is screw-coupled to the screw hole 65a and the slug moving shaft 64a is inserted through the through hole 65b in the sliding member 63 inserted into the slug 61b, in contrast to the sliding member 63 inserted into the slug 61a. Therefore, as the slug moving shaft 64a is rotated, the slug 61a is vertically moved, and as the slug moving shaft 64b is rotated, the slug 61b is vertically moved. That is, the slugs 61a and 61b are vertically moved by a screw mechanism including the slug moving shafts 64a and 64b and the sliding member 63.

Figure 5:
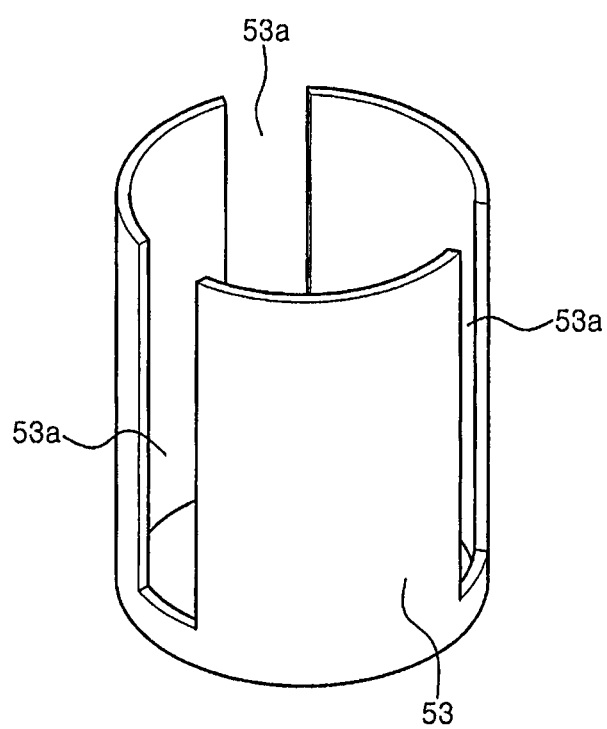
FIG. 5 is a perspective view showing an inner conductor in the main body of the tuner.

As shown in FIGS. 4 and 5, in the inner conductor 53, three slits 53a are equidistantly provided along the longitudinal direction thereof. Three projections 63a, which correspond to the slits 53a, are equidistantly provided on the sliding member 63. The sliding members 63 are respectively inserted and fixed into the slugs 61a and 61b under a state where the corresponding projections 63a thereof are brought into contact with the inner circumferences of the slugs 61a and 61b. The outer circumference surfaces of the sliding members 63 come into contact with the inner circumference surface of the inner conductor 53 without a space margin therebetween, and as the slug moving shafts 64a and 64b are rotated, the sliding members 63 slide along the inner conductor 53 to move vertically. Specifically, the inner circumference surface of the inner conductor 53 functions as a sliding guide for the slugs 61a and 61b, and it is preferable to set the width of the inner conductor 53 to be 5 mm or smaller. Accordingly, as will be described below, since a microwave power leakage into the inner conductor 53 can be eliminated, the radiation efficiency of the microwave power is able to be highly maintained.

An example of the resin material of which the sliding members 63 are made preferably includes a Polyphenylene sulfide (PPS) resin (Trademark: Bearee AS5000 (available from NTN Corporation)), which has a high sliding characteristic and is relatively easy to process.

As shown in FIG. 3, in the upper part of the tuner main body 51, there is provided a shielding plate 66 for shielding an opening of the upper part. The slug moving shafts 64a and 64b extends to the slug driving unit 70 through the shielding plate 66 and a heat dissipation unit 92 of the heat dissipation device 90 which will be later described. Bearings (not shown) are provided between the slug moving shafts 64a, 64b and the shielding plate 66. A bottom plate 67 formed of a conductor is provided at the lower end of the inner conductor 53. Each of the slug moving shafts 64a and 64b typically has an opening at the lower ends thereof to absorb the moving vibration, and the bottom plate 67 is spaced about 2 to 5 mm from the lower end of the slug moving shafts 64a and 64b. The bottom plate 67 can also function as a bearing member to support the slug moving shafts 64a and 64b.

The slug driving unit 70 includes a housing 71. The slug moving shafts 64a and 64b extends into the housing 71, and gears 72a and 72b are attached to the upper ends of the slug moving shafts 64a and 64b, respectively. Also included in the slug driving unit 70 are motors 73a and 73b that rotate the slug moving shafts 64a and 64b, respectively. Gears 74a and 74b are attached to shafts of the motors 73a and 73b, respectively. Further, the gear 74a engages with the gear 72a, and the gear 74b engages with the gear 72b. Accordingly, the slug moving shaft 64a is rotated by the motor 73a via the gears 74a and 72a, and the slug moving shaft 64b is rotated by the motor 73b via the gears 74b and 72b. The motors 73a and 73b are, e.g., stepping motors.

The slug moving shaft 64b is longer and reaches a higher position than the slug moving shaft 64a, and thus the position of the gears 72a and 72b are vertically offset and the position of the motors 73a and 73b are also vertically offset. As a result, it is possible to reduce the volume of the power transmission mechanism including the motor, gear, and the like, and it is also possible for the housing 71, which accommodates these parts therein, to have the same diameter as the outer conductor 52.

On top of the motors 73a and 73b and directly connected to the output shafts of the motors 73a and 73b, there are provided incremental encoders 75a and 75b for detecting positions of the slugs 61a and 61b, respectively.

A typical incremental encoder is usually only capable of detecting a relative position in a moving direction, but in this present embodiment, absolute positions are determined by using the incremental encoders 75a and 75b. The order of determining the absolute position will be described as follows.

First, by slowly rotating the slug moving shaft 64a, the slug 61a is moved at a constant speed while watching a counter of the encoder 75a. When the slug 61a reaches a mechanical stop (not shown), the motor 73a steps out and is stopped. The stopping of the motor 73a can be detected by an unchanged count of the encoder 75a, and at this time, a position of the slug 61a or a position offset by a predetermined pulse therefrom is set to an origin. An absolute position of the slug 61*a* can be detected by setting the origin as a reference point and counting the number of pulses from the origin. An absolute position of the slug 61*b* can be detected by locating its origin from the same procedure. Therefore, a sensor for detecting the position is unnecessary.

The positions of the slugs 61*a* and 61*b* are controlled by a slug controller 68. Specifically, based on an impedance value of an input terminal detected by an impedance detector (not shown) and position information of the slugs 61*a* and 61*b* detected by the encoders 75*a* and 75*b*, the slug controller 68 sends control signals to the motors 73*a* and 73*b* to control the positions of the slugs 61*a* and 61*b*, respectively, thereby adjusting the impedance. The slug controller 68 performs impedance matching until a terminal impedance reaches, e.g., 50Ω. If only one of the two slugs 61*a* and 61*b* is moved, a trajectory is to pass through the origin of the Smith chart, and if both are moved, only a phase rotation is performed.

Also, if the slug moving shafts 64*a* and 64*b* has trapezoidal threads, the position accuracy of each of the slugs 61*a* and 61*b* may become low due to a backlash. However, by, e.g., applying a pressure by a coil spring to each of the slugs 61*a* and 61*b*, it is possible to relieve the impact of a backlash.

The antenna unit 80 includes a planar antenna 81 having flat-shaped slots 81*a* that functions as a microwave radiation antenna. The antenna unit 80 also includes a wave retardation member 82 provided on an upper surface of the planar antenna 81; and a ceiling plate 83 provided on a front end of the planar antenna 81 and made of a dielectric member such as quartz, ceramic, or the like for vacuum sealing. A cylindrical member 82*a* made of a conductor extends through a central portion of the wave retardation member 82 to connect the bottom plate 67 with the planar antenna 81. Thus, the inner conductor 53 is connected to the planar antenna 81 via the bottom plate 67 and the cylindrical member 82*a*. Further, the lower side of the outer conductor 52 included in the tuner main body 51 of the tuner 60 extends to the planar antenna 81 and the outer conductor 52 covers the surroundings of the wave retardation member 82. The surroundings of the planar antenna 81 and the ceiling plate 83 are covered with a coated conductor.

The wave retardation member 82 has a larger permittivity than a vacuum and is formed of, e.g., quartz, ceramic, a fluorine-based resin such as polytetrafluoroethylene, or a polyimide-based resin. In addition, since the wavelength of the microwave is long in the vacuum, the wave retardation member 82 shortens the wavelength of the microwave to scale down the antenna. The phase of the microwave can be controlled by adjusting the thickness of the wave retardation member 82, and thus the thickness of the wave retardation member 82 is adjusted in such a way that the antinodes of the standing wave are formed in the planar antenna 81. Therefore, it is possible to minimize the reflection and maximize the radiation energy of the planar antenna 81.

Figure 6:
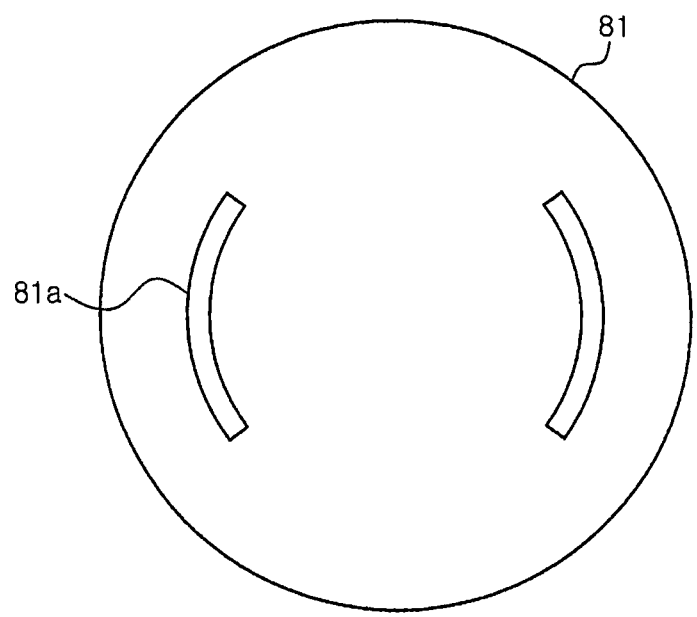
FIG. 6 is a plan view showing a planar antenna installed in the microwave introducing mechanism.

Then, the microwaves amplified by the main amplifier are transmitted through a space between the inner conductor 53 and the outer conductor 52, and are radiated from the slots 81*a* of the planar antenna 81 into the chamber 1 through the ceiling plate 83. As shown in FIG. 6, it is preferable that the slots 81*a* are fan-shaped and two or four slots 81*a* are provided. Thus, the microwave can be efficiently delivered in a TEM (Transverse Electromagnetic) mode.

In this embodiment, the main amplifier 47, the tuner 60, and the planar antenna 81 are spaced closely together. The tuner 60 and the planar antenna 81 are included in a lumped constant circuit that exists within a ½ wavelength, and the combined resistances of the planar antenna 81, the wave retardation member 82, and the ceiling plate 53 are set to 50Ω. Accordingly, the tuner 60 directly performs tuning of the plasma load and thus efficiently transmits energy to the plasma.

The heat dissipation device 90 serves to dissipate heat from the antenna unit 80. As shown in FIGS. 3 and 4, the heat dissipation device 90 includes two heat pipes 91 provided, in a linear shape along the longitudinal direction of the inner conductor 53 of the tuner 60, inside the inner conductor 53; and a heat dissipation unit 92 for radiating the heat which the heat pipes 91 have extracted from the antenna unit 80.

The heat dissipation unit 92 is disposed on the upper side of the shielding plate 66 and formed of, e.g., a heat sink. The heat sink may have a fan on the inside. The heat dissipation unit 92 may also be formed of a cooling unit that circulates a cooling medium, such as a coolant or the like.

One end of the heat pipe 91 is located at the antenna unit 80 and the other end thereof goes through the shielding plate 66 to the inside of the heat dissipation unit 92. From this, the heat pipe 91 serves to transfer the heat from the antenna unit 80 to the heat dissipation unit 92. In the present embodiment, one end of the heat pipe 91 extends through the bottom plate 67 and reaches the inside of the cylindrical member 82*a* provided in the center of the wave retardation member 82. One end of the heat pipe 91 on the side of the antenna unit 80 serves as a heat input end, while the other end thereof on the side of the heat dissipation unit 92 serves as a heat dissipation end.

Figure 7:
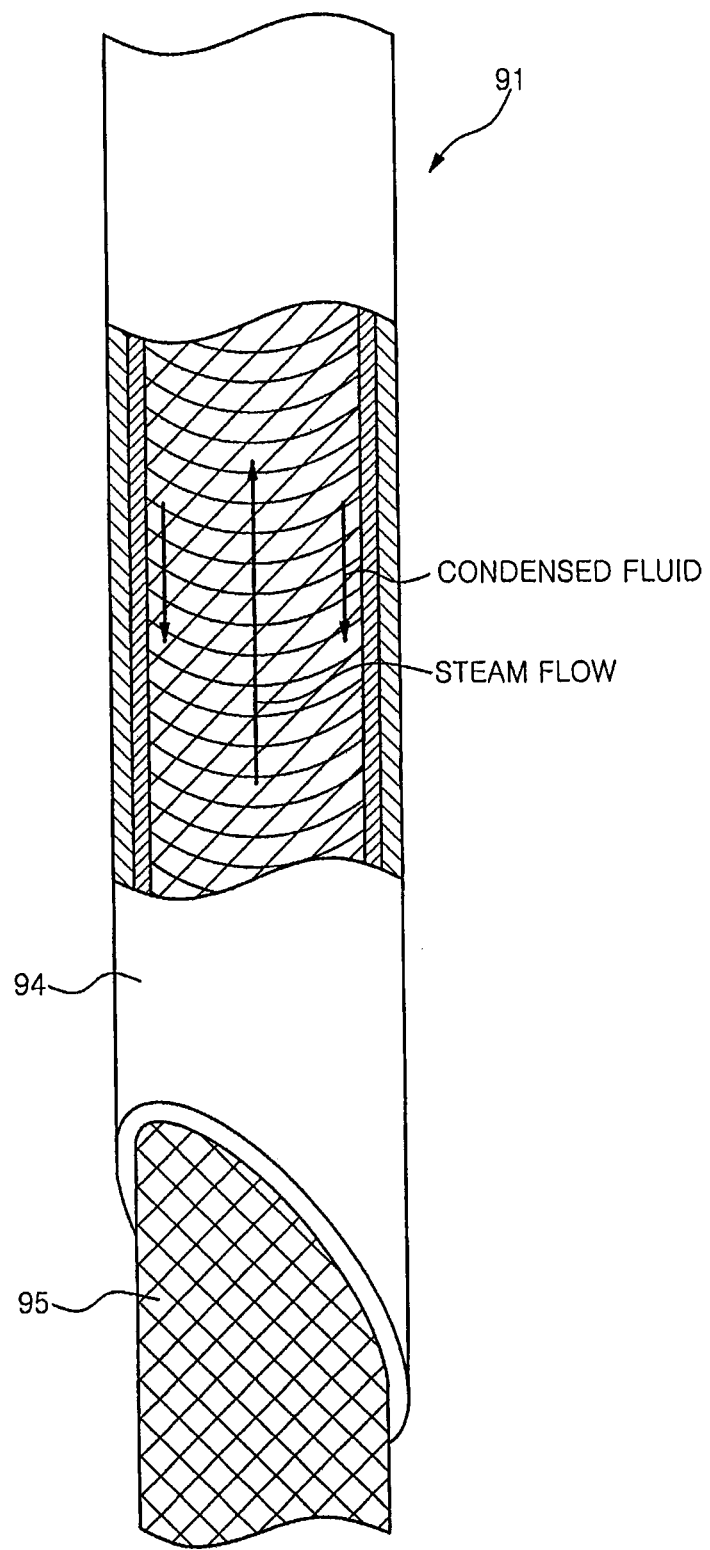
FIG. 7 is a schematic view showing a structure of a heat pipe used in the microwave introducing mechanism.

The heat pipe 91, as shown in FIG. 7, includes a container 94, serving as an outer frame member which has a cylindrical shape with opposite closed ends and is formed of a metal, e.g., copper or copper alloy; and a wick 95 formed of a porous member or a net-shaped member disposed at an inner circumference wall of the container 94. The heat pipe 91 has a sealed structure and the inside of the container 94 is filled with an operation fluid such as water. The wick 95 moves the operation fluid by using a capillary action. The heat pipe 91 serves to transport large amount of heat from one side to the other side easily by using evaporation phenomenon and condensation phenomenon of the filled operation fluid. Specifically, at the heat input end disposed in the antenna unit 80 whose temperature is increased to a high level due to the heat transferred from the plasma and the loss of microwaves, the operation fluid is evaporated by the heat inputted from the antenna unit 80 and the evaporated fluid becomes a steam flow. The steam flow is quickly moved to the heat dissipation end disposed in the heat dissipation unit 92, and there, heat exchange is performed between the steam flow and the heat dissipation unit 92, so that the steam flow is cooled to turn into a condensed fluid. Thereafter, the condensed fluid is returned to the heat input end by the capillary action of the wick 95.

As shown in FIG. 4, in the sliding member 63, two insertion through-holes 93, through which the heat pipes 91 are inserted, are formed. Each of the insertion through-holes 93 has a diameter large enough to suppress the heat pipe 91 from coming into contact therewith. Alternatively, the insertion though-hole 93 and the heat pipe 91 may be brought into contact with each other without a space margin, and in this case, the heat pipe 91 may function as a guiding member for the sliding member 63.

Figure 8:
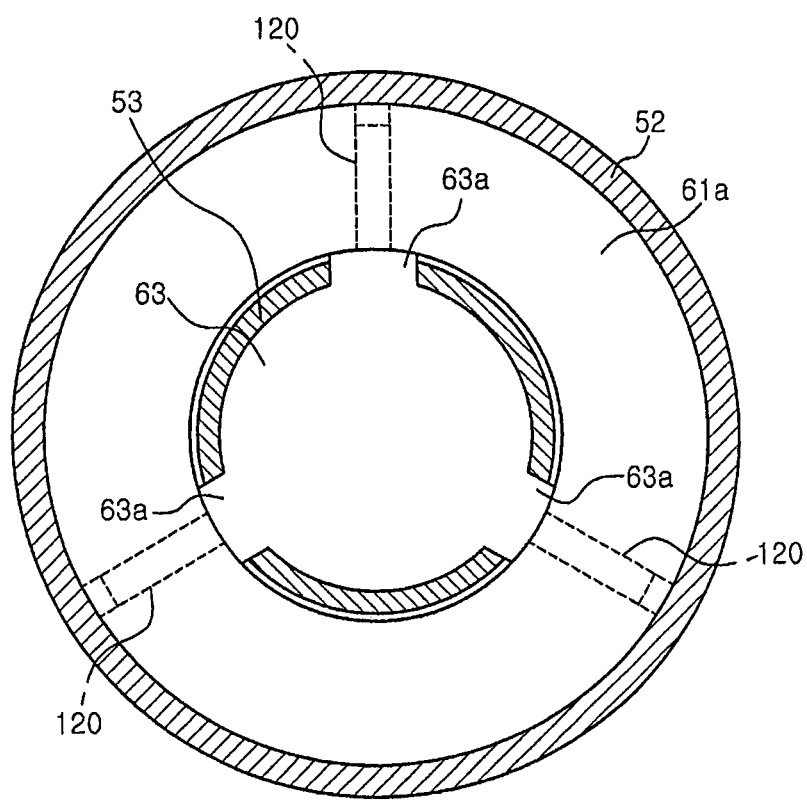
FIG. 8 is a horizontal cross-sectional view showing a state where the sliding member is fixed to the slug.
Figure 9:
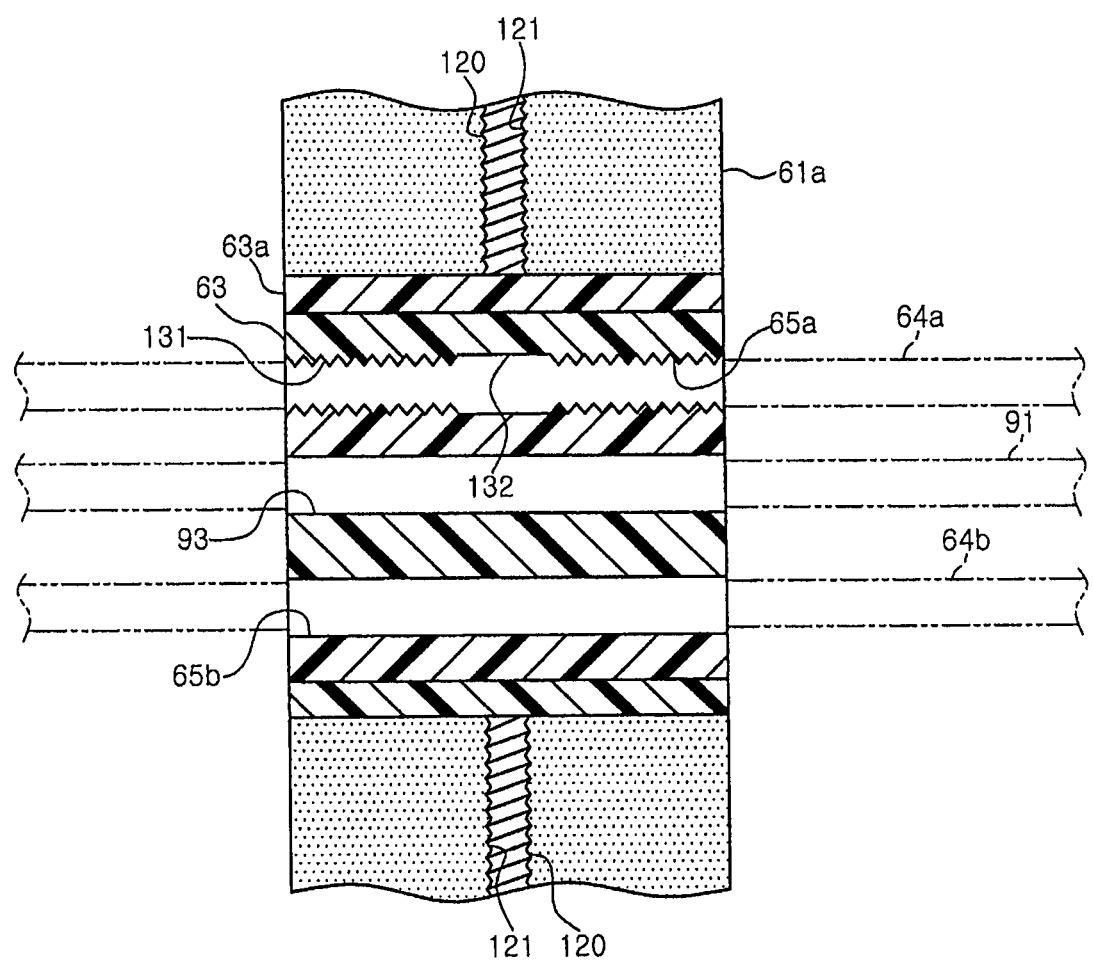
FIG. 9 is a cross-sectional view showing a state where the sliding member is fixed to the slug.
Figure 10:
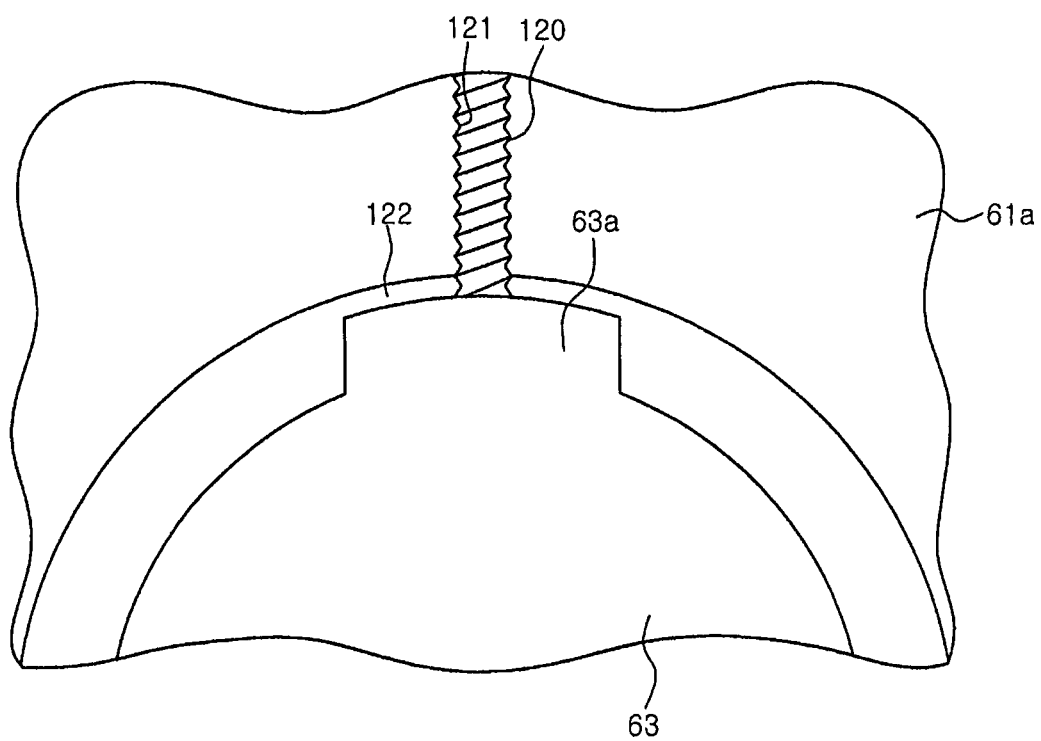
FIG. 10 is an enlarged view showing an installation portion of the sliding member and the slug.

As shown in FIGS. 8 to 10, the sliding member 63 is fixed to the slug 61*a* by fixing screws 120, which is also the same for slug 61*b*. The fixing screws 120 are preferably made of the same dielectric material as that of the slugs 61*a* and 61*b*, such as ceramic, resin, or the like. As shown in FIG. 8, three fixing screws 120 are respectively provided at positions corresponding to the three projections 63*a* of the slug 61*a*. Additionally, as shown in FIG. 9, the fixing screws 120 are screw-coupled to screw holes 121 provided in such a way as to be screwed from the outside of the slug 61*a* towards the inside thereof. By tightening the three fixing screws 120, the front ends thereof come into contact with the sliding member 63 and the sliding member 63 is equally secured. Therefore, even if the slug 61*a* is affected from the heat, it can still securely maintain the sliding member 63. To prevent the fixing screws 120 from coming into contact with the outer conductor 52, heads of the fixing screws 120 are disposed at an inner side of the outer circumference surface of the slug 61*a* (and 61*b*). For convenience, FIG. 8 does not show the inside configuration of the sliding member 63.

In this case, if threads (screw threads and thread grooves) are formed throughout the entire screw hole 65*a* and are affected by the heat, the fixing pressure of the fixing screws 120 may inhibit the rotation of the slug moving shaft 64*a*, whereby the slug 61*a* is not able to move. To prevent such an occurrence, as shown in FIG. 9, it is preferable to form the threads at a portion 131 other than a portion 132 which corresponds to the area, of the screw hole 65*a*, pressed by the fixing screw 120 (i.e., the portion affected by the tightened portion by the fixing screw 120, including an intersection area between the screw hole 65*a* and a plane including the axes of the three fixing screws 120)

As such, it is possible to securely fix the sliding member 63 to the slug 61*a* by using the fixing screws 120, even if a gap 122 is formed between the sliding member 63 and the slug 61*a* due to thermal deformation and the like, as shown in FIG. 10.

Figure 11:
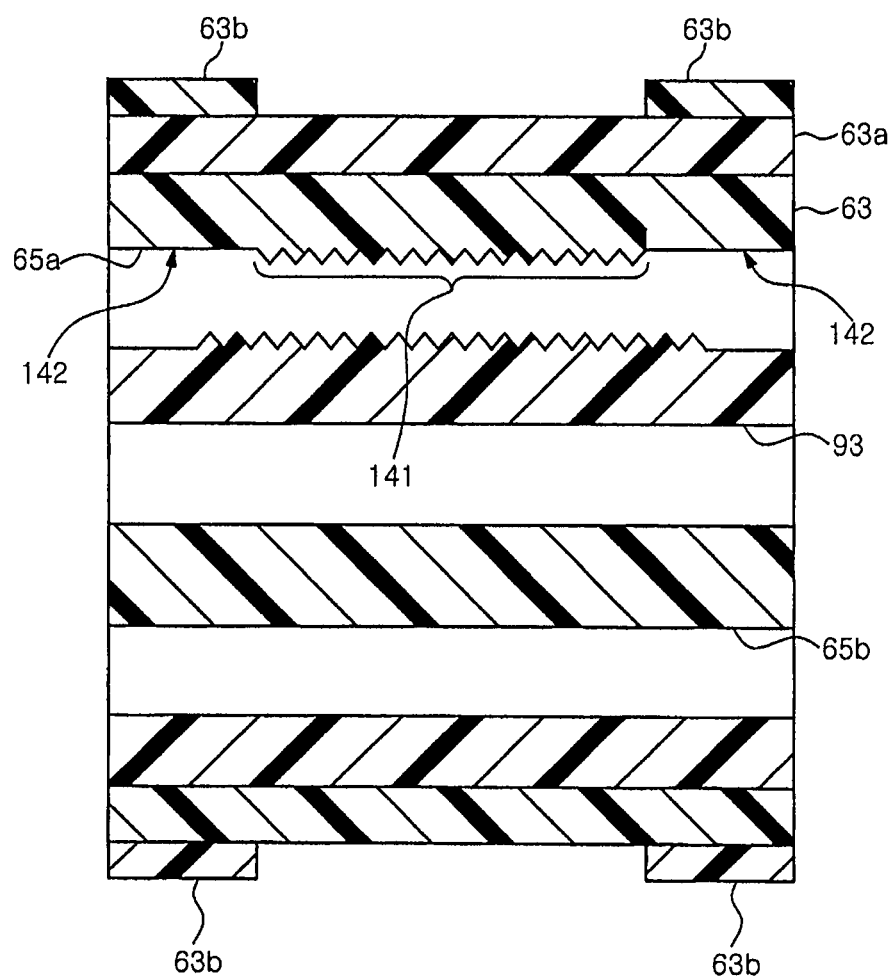
FIG. 11 is a cross-sectional view showing another example of a method to secure the sliding member to the slug.

The sliding member 63 may be fixed to the slugs 61*a* (and 61*b*) by press-fitting. In this case, as shown in FIG. 11, protrusions 63*b* are provided at axially opposite ends of the projections 63*a* and the protrusions 63*b* are press-fitted into the slug 61*a* by pressing the sliding member 63 into the slug 61*a*. Therefore, the sliding member 63 is fixed to the slug 61*a* by the protrusions 63*b* press-fitted into the slug 61*a*.

In this case, if threads (screw threads and thread grooves) are formed throughout the entire screw holes 65*a* and are affected by the heat, the rotation of the slug moving shaft 64*a* may be inhibited by the deformation of the screw hole 65*a* caused by the pressure applied to the protrusion 63*b* of the sliding member 63, whereby the slug 61*a* is not able to move. To prevent such an occurrence, as shown in FIG. 11, it is preferable to form the threads at a portion 141 rather than portions 142 which are opposite end portions of the screw hole 65*a* corresponding to the protrusions 63*b*.

The components in the plasma processing apparatus 100 are controlled by a control unit 110 including a micro processor. The control unit 110 includes a display, an input device, a memory unit for storing process sequences of the plasma processing apparatus 100 and process recipes as control parameters, and the like. The control unit 110 controls the plasma processing apparatus 100 in accordance with a selected process recipe.

Next, an operation of the plasma processing apparatus 100 having such an above-mentioned configuration will be explained.

First, the wafer w is loaded into the chamber 1 and mounted on top of the susceptor 11. While a plasma generating gas, e.g., argon gas, is introduced from the plasma generating gas supply source 27 into the chamber 1 through the line 28 and the plasma generating gas introducing member 26, a microwave is introduced from the microwave plasma source 2 into the chamber 1, thereby generating a plasma.

After the plasma is generated, a processing gas, e.g., an etching gas such as $Cl_2$ gas is injected from the processing gas supply source 25 into the chamber 1 through the line 24 and the shower plate 20. The injected processing gas is excited and turned into a plasma or a radical by the plasma having passed through the space portions 23 of the shower plate 20. A plasma process, e.g., an etching process, is performed on the wafer W by the plasma or the radical of the processing gas.

In order to generate the microwave plasma, in the microwave plasma source 2, the microwave oscillated by the microwave oscillator 32 of the microwave output unit 30 is amplified by the amplifier 33 and distributed in multiples by the divider 34. The distributed microwaves are directed to the microwave introduction unit 40 via the microwave supply unit 50.

In order for each of the microwave introducing mechanisms 41 included in the microwave introduction unit 40 to obtain sufficient outputs, microwave powers are supplied from the two amplifier sections 42 to the tuner main body 51 through the coaxial cable 56, the two microwave power introduction ports 55, provided at the power combining unit 54, and the power supply antenna 58. Then, the supplied microwave powers are combined therein. Thus, while the heat is suppressed, power combination may be simply conducted. Further, if a sufficient power can be supplied from just one amplifier section 42, the power combination may be omitted. Alternatively, three or more microwave power introduction ports 55 may be provided and powers from three or more amplifier sections 42 may be combined.

As a result, the impedance is automatically controlled by the tuners 60 of the microwave introducing mechanisms 41, and in a state where there is no substantial power reflection, the microwave power is radiated into the chamber 1 via the planar antenna 81 and the ceiling plate 83 of the antenna unit 80.

The microwaves, distributed in multiples and individually amplified by the main amplifier 47 serving as a solid state amplifier, are individually radiated by using the planar antenna 81 and thereafter combined inside the chamber 1. Accordingly, a large isolator or a synthesizer is not needed.

In the microwave introducing mechanism 41, the antenna unit 80 and the tuner 60 are configured densely in the main body 51. Thus, the microwave plasma source 2 itself can be miniaturized. Also, the main amplifier 47, the tuner 60, and the planar antenna 81 are disposed in close proximity and in particular, the tuner 60 and the planar antenna 81 can be configured as a lumped constant circuit. For this reason, by designating the combined resistances of the planar antenna 81, the wave retardation member 82, and the ceiling plate 83 as 50Ω, the plasma load can be tuned in a high density by the tuner 60. Further, the tuner 60 functions as a slug tuner which can perform the impedance matching by simply moving the two slugs 61*a* and 61*b*, resulting in a compact tuner with low loss.

Additionally, as described above, the tuner 60 and the planar antenna 81 are arranged closely together and configured as a lumped constant circuit and also function as a resonator. Owing to this, the impedance mismatching over the planar antenna 81 can be resolved with high density and the substantially mismatched portion can be used as a plasma space, so that it is possible to control a high density plasma with the tuner 60.

Further, by changing the phase of each antenna module with the phase shifter 45, the directivity of the microwave can be controlled and the adjustment of the distribution of the plasma and the like can be facilitated.

In a conventional tuner, a driving device for driving slugs, thus controlling impedance, is provided on the outside of a body of a tuner. This driving device needs a driving unit such as a motor and the like; a driving delivery unit such as a ball screw and the like; a driving guide unit such as an LM (Linear Motion) guide and the like; and a supporting unit such as a bracket and the like, leading to a large size by itself. Additionally, a slit is required to be provided on an outer conductor to move the supporting unit and a very large shield mechanism is needed to block the leakage of electromagnetic waves from the slit, and a large motor is also necessary. Accordingly, the tuner including the driving device and the shield mechanism increases in scale.

Contrastingly, in the present embodiment, the parts that correspond to the driving delivery unit, the driving guide unit, and the supporting unit are disposed within the inner conductor 53 of the tuner 60, thereby making the moment (e.g., torque) and the weight of the machine elements smaller. Further, the slit for moving the supporting unit is not required on the outer conductor 52 and the shield mechanism for blocking the leakage of electromagnetic waves is also unnecessary. Thus, the driving device for driving the slugs 61*a* and 61*b* can be even more compact than the conventional one, and the whole part of the tuner 60 of the present embodiment can be miniaturized.

Further, in the present embodiment, the sliding member 63, made of resin with the sliding characteristic, is attached to the slugs 61*a* and 61*b*; a screw apparatus is configured by screwing the slug moving shaft 64*a* or 64*b* into the screw hole 65*a* of the sliding member 63; and the outer circumference of the sliding member 63 is guided to slide along the inner circumference of the inner conductor 53 by respectively rotating the slug moving shafts 64*a* and 64*b* with the motors 73*a* and 73*b* in order to move the slugs 61*a* and 61*b*. In summary, the sliding member 63 and the slug moving shafts 64*a* and 64*b* serve as the driving delivery unit, driving guide unit, and the supporting unit to thereby make the driving device very compact and the tuner 60 miniaturized further.

Meanwhile, in this plasma process, the temperature of the antenna unit 80, especially the planar antenna 81 and the ceiling plate 83 formed of a dielectric member, is greatly increased by the heat inputted from the plasma and the heat caused by the microwave loss when a large power density of microwaves are supplied from the microwave output unit 30. In a configuration where the heat dissipation device 90 does not exist, the temperature of the inner conductor 53 increases because the heat from the antenna unit 80 is transferred only to the inner conductor 53.

If the temperature of the inner conductor 53 rises, the mobility of the slugs 61*a* and 61*b* along the inner conductor 53 is reduced due to, for example, thermal deformation of the inner conductor 53 or thermal expansion of the slugs 61*a* and 61*b* by the heat transferred from the inner conductor 53. Particularly, in the present embodiment, the mobility of the slugs 61*a* and 61*b* is greatly affected by the thermal deformation of the inner conductor 53 and the like since the outer circumference surface of the sliding member 63 is contacted to the inner circumference surface of the inner conductor 53 without a space margin.

In the present embodiment, this problem is solved by providing the heat dissipation device 90 and allowing the heat from the antenna unit 80 to be dissipated to the heat dissipation unit 92 through the heat pipe 91. Specifically, the heat pipe 91 is provided in such a way that the heat input end thereof is disposed in the antenna unit 80 having a high temperature and the heat dissipation end thereof is disposed in the heat dissipation unit 92 provided on the upper surface of the shielding plate 66. At the heat input end, an operation fluid is evaporated by the heat inputted from the antenna unit 80 to become a steam flow and the steam flow is quickly moved to the heat dissipation end disposed in the heat dissipation unit 92. At this time, the heat from the steam flow is transferred to the heat dissipation unit 92, and thus cooled steam flow becomes a condensed fluid. Therefore, a large volume of heat can be transported from the antenna unit 80 to the heat dissipation unit 92.

As a result, the heat transfer from the antenna unit to the inner conductor 53 is suppressed, so that the thermal deformation of the inner conductor 53 and the thermal expansion of the slugs 61*a* and 61*b* are inhibited. Accordingly, the heat effects on the mobility of the slugs 61*a* and 61*b* can be suppressed to thereby obtain good mobility. Also, by installing the heat pipes 91 inside of the inner conductor 53, it is possible to transfer the heat from antenna unit 80 to the heat dissipation unit 92 without having an effect on the microwave that is transferred through the microwave transmission line.

Further, the sliding member 63 is equally fixed to the slugs 61*a* and 61*b* by using the fixing screws 120, and even in the case where, for example, the slug 61*a* is affected by the heat and a gap is formed between the projections 63*a* of the sliding member 63 and the slug 61*a*, the sliding member 63 can still be securely supported. At this time, by using the fixing screws 120 having the same material as those of the slugs 61*a* and 61*b*, it is possible to reduce thermal expansion variation and the effect of the heat and substantially remove permittivity fluctuations caused by the fixing screws 120.

Furthermore, in the screw hole 65*a* to which the slug moving shaft 64*a* is screwed, threads are not formed at the portion 132 which corresponds to the fixing screw 120. Therefore, the rotation of the slug moving shaft 64*a* is prevented from being inhibited by the pressure from the tightened portion of the fixing screw 120 to thereby make the slug 61*a* unable to move due to the effect of the heat.

On this wise, by fixing the sliding member 63 with the fixing screw 120, the effect of the heat can be mitigated and even if the heat dissipation device 90 is not provided, the effect caused by the heat on the slug mobility may be evaded.

In the case where the sliding member 63 is secured to the slugs 61*a* and 61*b* by press-fitting, threads are not formed at the opposite ends 142 of the screw hole 65*a*, corresponding to the protrusion 63*b*. Accordingly, if it is affected by the heat, it is possible to prevent the rotation of the slug moving shaft 64*a* from being inhibited by the pressure applied to the protrusion 63*b* of the sliding member 63. Eventually, the slug 61*a* is prevented from being unable to move. In this case, the effect of the heat can be mitigated and even if the heat dissipation device 90 is not provided, the effect caused by the heat on the slug mobility may be evaded.

Moreover, in the above configuration, the through hole 65*b* is provided in the sliding member 63, and the slug moving shaft 64*a* or 64*b* that is not screwed to the screw hole 65*a* passes through the through hole 65*b*. Accordingly, the two slug moving shafts 64*a* and 64*b* for respectively moving the slugs 61*a* and 61*b* can be provided inside the inner conductor 53, and the two slugs 61*a* and 61*b* can be moved independently by a screwing device. Also, in the slug driving unit 70, the motors 73*a* and 73*b* and the gears 72*a* and 72*b* serving as a power transmission mechanism are vertically offset, so that the space for the power transmission mechanism can be made small and the housing 71 that accommodates these elements can have the same diameter as that of the outer conductor 52. Thus, the tuner 60 can be made even further compact.

In addition, in the slugs 61*a* and 61*b*, the sliding member 63 slides along the inner conductor 53, and thus a small moving load is applied thereto. Accordingly, the threads of the slug moving shafts 64*a* and 64*b* may be trapezoidal threads or less expensive ones. At this time, the positioning accuracy may be reduced due to the screw backlash. However, this problem can be resolved by providing a biasing unit such as a coil spring and the like.

Furthermore, the incremental encoders 75a and 75b are provided to be directly connected to output axes of the motors 73a and 73b in order to detect the positions of the slugs 61a and 61b. Accordingly, a sensor that is conventionally used for position detection becomes unnecessary and thus complicating the system or providing space to install a sensor can be avoided. Further, in comparison to an absolute encoder, the incremental encoders 75a and 75b are more affordable. Therefore, a small high density tuner 60 with no cost increase may be realized.

Moreover, in the inner conductor 53, the slit 53a is provided to move the projections 63a of the sliding member 63. From the slit 53a, the microwave power may leak into the inner conductor 53, causing power loss, but by keeping the width of the silt 53a less than 5 mm, the microwave power leakage into the inner conductor 53 can be virtually eliminated and the high radiation efficiency of the microwave power can be maintained.

Next, the microwave introducing mechanisms 41 in accordance with another embodiment will now be described.

Figure 12:
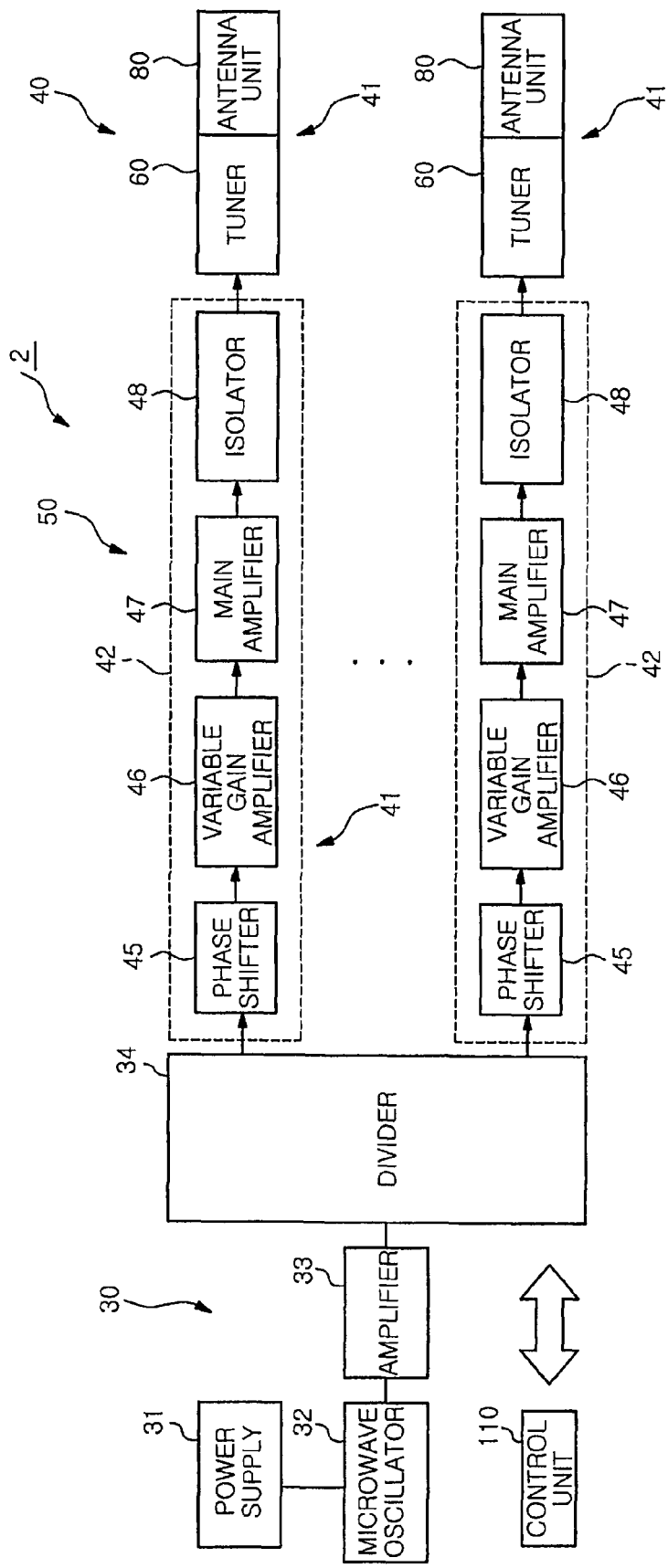
FIG. 12 shows a configuration of a microwave plasma source with the microwave introducing mechanism in accordance with another embodiment of the present invention.
Figure 13:
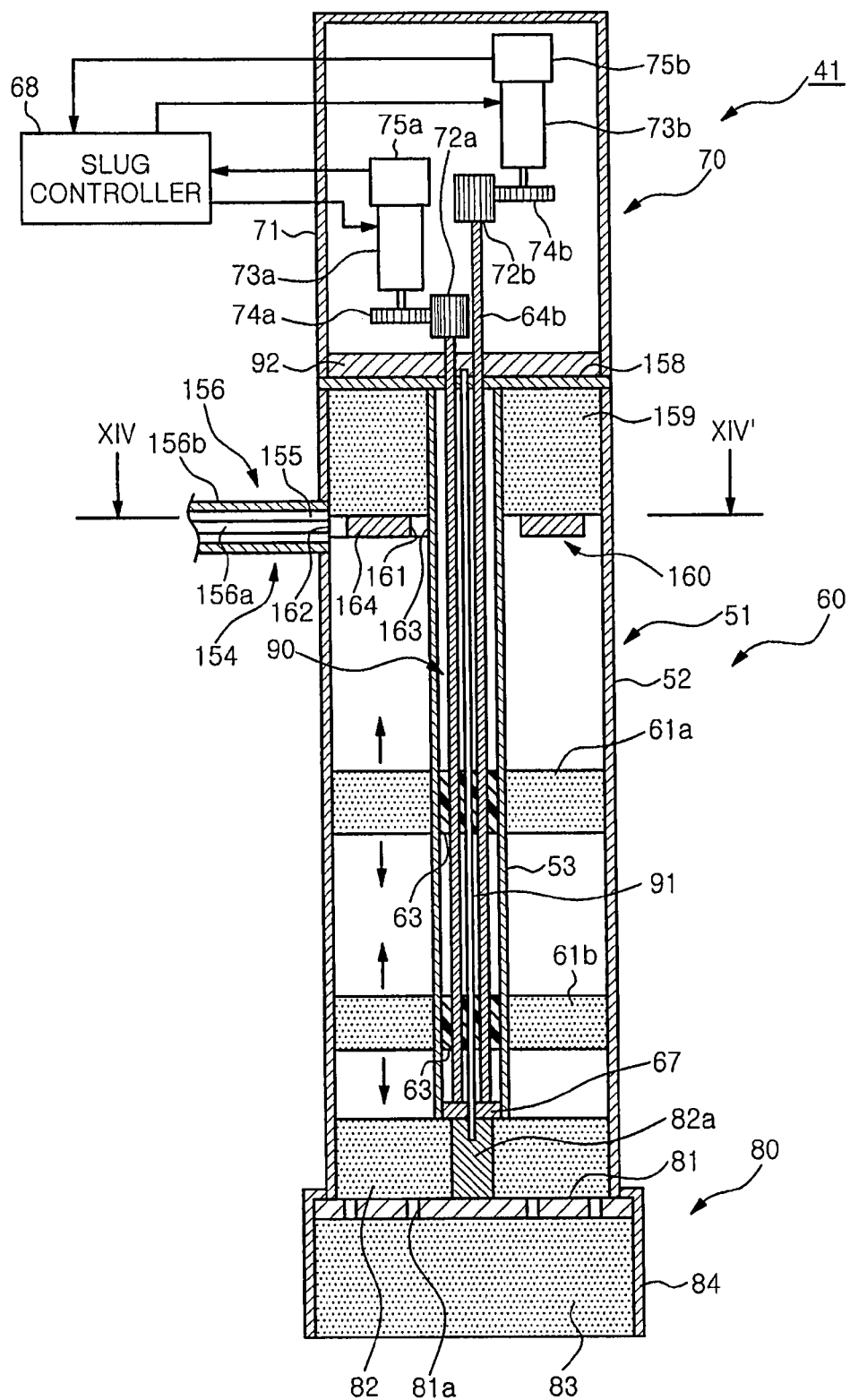
FIG. 13 is a vertical cross sectional view showing the microwave introducing mechanism in accordance with another embodiment of the present invention.
Figure 14:
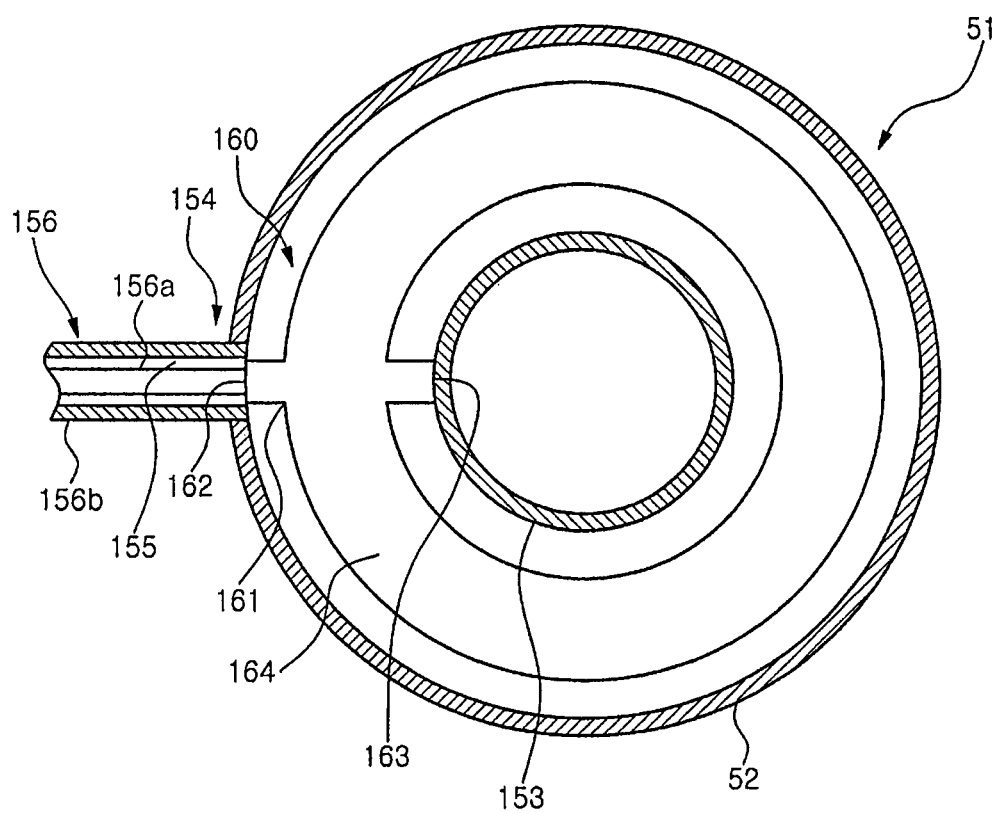
FIG. 14 is a horizontal cross-sectional view taken along line XIV-XIV' in FIG. 13.

In the above embodiment, an example shows that microwaves introduced into the microwave introducing mechanism 41 through two microwave power introduction ports 55 are spatially combined and radiated to the antenna unit 80; but in the present embodiment, an example shows that the microwaves are introduced from just one place. FIG. 12 shows a configuration of a microwave plasma source that has a different microwave introducing mechanism in accordance with another embodiment of the present invention, FIG. 13 shows a longitudinal cross-sectional view of the microwave introducing mechanism, and FIG. 14 shows a horizontal cross-sectional view taken along line XIV-XIV' in FIG. 13. In the present embodiment, the substantially same components as those in the previous embodiment are denoted by the same reference characters, and thus a redundant description thereof will be omitted.

In the present embodiment, as shown in FIG. 12, in the microwave plasma source 2, the microwaves amplified by one amplifier section 42 included in the microwave supply unit 50 are supplied to one microwave introducing mechanism 41. As shown in FIG. 13, a microwave supply mechanism 154 is provided at a base end side of the outer conductor 52 of the tuner 60 included in the microwave introducing mechanism 41. To introduce a microwave power, the microwave supply mechanism 154 includes a microwave power introduction port 155 disposed on a side surface of the outer conductor 52. Connected to the microwave power introduction port 155 is a coaxial cable 156, including an inner conductor 156a and an outer conductor 156b, serving as a microwave supply line for supplying a microwave amplified by the amplifier section 42. Also, a power supply antenna 160 extending horizontally toward the inside of the outer conductor 52 is connected to a leading end of the inner conductor 156a of the coaxial cable 156.

The power supply antenna 160 is formed by cutting a metal plate made of, e.g., aluminum or the like and fitting it into a frame of a dielectric member made of Teflon™ or the like. Between the power supply antenna 160 and a reflecting plate 158, there is provided a wave retardation member 159, made of a dielectric member such as Teflon™ or the like, to shorten an effective wavelength of a reflected wave.

In the case when using a high frequency microwave of 2.45 GHz or the like, the wave retardation member 159 is unnecessary. At this time, maximized electromagnetic waves are transmitted into the coaxial tuner main body 51 by reflecting the electromagnetic waves radiated from the power supply antenna 160 by using the reflection plate 158. In this case, the distance from the power supply antenna 160 to the reflection plate 158 is set to approximately a multiple of the half-wavelength of λg/4. However, at a low frequency microwave, the distance may not be suitable due to the diametrical restriction. In this case, it is preferable to optimize the shape of the power supply antenna 160 in such a way as to form antinodes of microwaves, generated from the power supply antenna 160, below the power supply antenna 160, rather than right at the power supply antenna 160.

As shown in FIG. 14, the power supply antenna 160 is connected to the inner conductor 156a of the coaxial cable 156 at the microwave power introduction port 155, and includes an antenna main body 161 and an annular reflection member 164. The antenna main body 161 includes a first pole 162 to which electromagnetic waves are supplied; and a second pole 163 that radiates the supplied electromagnetic waves. The reflection member 164 extends along the outer side of the inner conductor 53 from opposite sides of the antenna main body 161. In this configuration, a standing wave is generated by the electromagnetic waves incident to the antenna main body 161 and the electromagnetic waves reflected from the reflection member 164. The second pole 163 of the antenna main body 161 is in contact with the inner conductor 53.

As the power supply antenna 160 radiates microwaves, the microwave power is supplied into a space between the outer conductor 52 and the inner conductor 53. Also, the microwave power supplied to the microwave supply mechanism 154 is propagated towards the antenna unit 80.

The present invention may not be limited to the above embodiments and various changes and modifications may be made without departing from the scope of the invention. For example, the circuit configuration of the microwave output unit 30, the microwave introduction unit 40, or the main amplifier 47 is not limited to the embodiment.

Specifically, the phase shifter 45 is unnecessary if it is not required to perform the directional control on the microwaves from the planar antenna 81 or obtain circularly polarized microwaves therefrom. In addition, a plurality of microwave introducing mechanisms 41 need not be included in the configuration of the microwave introduction unit 40 and it is acceptable to have just one microwave introducing mechanism 41. Further, even though the planar antenna 81 has been shown to have just two or four fan-shaped slots 81a provided, it is not limited to this case, and depending on the conditions, it is possible to employ several slot patterns. Also, in the above embodiment, the example shows only two provided slugs. However, the number of slugs may be more than two, and if the tuning range is pre-determined, it may be acceptable to have just one slug.

The driving device of the slugs 61a and 61b is not limited to the above embodiment which shows that there are provided, in the inner conductor 53, the driving delivery unit that delivers the driving force from the driving unit to the slugs 61a and 61b; the driving guide unit that guides the movement of the slugs 61a and 61b; and the supporting unit that supports the slugs 61a and 61b in the driving delivery unit. This driving device may be provided on the outside on the main body of the tuner 60.

Additionally, in the above embodiment, the driving device of the slugs 61a and 61b employs a screw mechanism including the slug moving shafts 64a and 64b having trapezoidal threads and the sliding member 63 that is screwed thereto. However, the threads are not limited thereto, and triangle, square, cog threads, and the like may also be used. Alternatively, ball screws may be employed to indirectly couple the slug moving shafts with the sliding member, or another mechanism such as a gear mechanism, belt mechanism, or the like may be used as a driving delivery mechanism. Further, the driving guide mechanism is not limited to the sliding mechanism and another guide such as an LM guide may be used. Additionally, the power transmission between the motor 73a (and 73b) and the slug moving shafts 64a (and 64b) is performed by the gear mechanism, but the power transmission may be carried out by another mechanism such as the belt mechanism.

In continuance, the example in the above embodiment shows the heat dissipation device 90 using two heat pipes 91, however, it is not limited to this, and the number of heat pipes 91 may be selected depending on the amount of heat generated by the antenna unit 80. Also, the location of the heat input end of the heat pipe 91 is not limited to the above embodiment and may be located at any position where the heat from the antenna unit 80 can be effectively radiated. The heat pipe 91 need not necessarily be disposed at the inner conductor 53, and also, the location of the heat dissipation unit 92 is not limited to the location described in the above embodiment.

Additionally, in the above embodiment, the plasma processing apparatus only shows an example of an etching processing apparatus, but it is not limited to this example, and may be applicable to various other plasma processes such as a film forming process, an oxynitriding film process, an ashing process, and the like. Furthermore, the target substrate is not limited to the semiconductor wafer, and various other types of substrates such as an FPD (Flat Panel Display) represented by an LCD (Liquid Crystal Display), ceramic substrate may be used.

What is claimed is:

1. A microwave introducing mechanism, provided in a microwave transmission line through which a microwave outputted from a microwave output unit of a microwave plasma source is transmitted, for introducing the microwave into a chamber, the microwave plasma source being configured to generate a microwave plasma in the chamber, the mechanism comprising:
an antenna unit including a planar antenna configured to radiate the microwave into the chamber through the microwave transmission line;
a tuner provided in the microwave transmission line to adjust an impedance of the microwave transmission line; and
a heat dissipation device configured to dissipate a heat from the antenna unit,
wherein the tuner includes:
a tuner main body having a tubular outer conductor and a tubular inner conductor coaxially provided in the outer conductor, the tuner main body serving as a part of the microwave transmission line;
a slug provided between the outer conductor and the inner conductor to be movable along a longitudinal direction of the inner conductor, the slug having an annular shape and being made of a dielectric material; and
a driving device configured to move the slug, wherein the driving device includes a sliding member being inserted into the slug and sliding along the inside of the inner conductor while being brought into contact with an inner circumference surface of the inner conductor, the sliding member having a screw hole, and
wherein the heat dissipation device includes:
a heat pipe, having a heat input end and a heat dissipation end, configured to transfer the heat of the antenna unit from the heat input end to the heat dissipation end by disposing the heat input end in the antenna unit; and
a heat dissipation unit provided at the heat dissipation end of the heat pipe to dissipate the heat transferred to the heat dissipation end.

2. The mechanism of claim 1, wherein the heat pipe is provided in the inner conductor.

3. The mechanism of claim 1, wherein the heat dissipation unit is formed of a heat sink or a cooling member.

4. The mechanism of claim 1, wherein the driving device includes:
a driving unit configured to supply a driving force;
a driving delivery unit configured to deliver the driving force supplied from the driving unit to the slug;
a driving guide unit configured to guide a movement of the slug; and
a supporting unit configured to support the slug in the driving delivery unit,
wherein the driving delivery unit, the driving guide unit and the supporting unit are accommodated inside the inner conductor.

5. The mechanism of claim 4, wherein, in the driving device, the driving delivery unit employs a screw mechanism including the sliding member and a slug moving shaft formed of a screw bar which is extended inside the inner conductor in a longitudinal direction thereof and is screwed into the screw hole of the sliding member; the driving guide unit serves as a sliding guide mechanism which is formed by the sliding member and the inner circumference surface of the inner conductor; the supporting unit is formed of the sliding member and the slug moving shaft; and the driving unit has a motor rotating the slug moving shaft, the driving unit rotating the slug moving shaft by using the motor to drive the slug in a state where the sliding member slides along the inner circumference surface of the inner conductor.

6. The mechanism of claim 1, wherein the sliding member is made of a resin having a sliding characteristic.

7. The mechanism of claim 1, wherein the sliding member is fixed to the slug by using a fixing screw.

8. The mechanism of claim 7, wherein threads are not formed at a portion corresponding to an area, in the screw hole of the sliding member, pressed by the fixing screw.

9. The mechanism of claim 1, wherein the sliding member has protrusions at outer peripheries of opposite ends thereof and is fixed to the slug by the protrusions press-fitted into the slug, and threads are not formed at portions, in the screw hole of the sliding member, corresponding to the protrusions.

10. The mechanism of claim 1, wherein the heat pipe is inserted through the sliding member inside the inner conductor.

11. The mechanism of claim 1, wherein the antenna unit and the tuner are integrally formed.

12. A microwave plasma source which converts a gas supplied into a chamber to a plasma by introducing a microwave into the chamber, the microwave plasma source comprising:
a microwave output unit configured to output a microwave;
a microwave transmission line through which the outputted microwave is transmitted; and
a microwave introducing mechanism provided in the microwave transmission line to introduce the transmitted microwave into the chamber,
wherein the microwave introducing mechanism includes:
an antenna unit including a planar antenna configured to radiate the microwave into the chamber through the microwave transmission line;

a tuner provided in the microwave transmission line to adjust an impedance of the microwave transmission line; and
a heat dissipation device configured to dissipate a heat from the antenna unit,
wherein the tuner has:
a tuner main body including a tubular outer conductor and a tubular inner conductor coaxially provided in the outer conductor, the tuner main body serving as a part of the microwave transmission line;
a slug provided between the outer conductor and the inner conductor to be movable along a longitudinal direction of the inner conductor, the slug having an annular shape and being made of a dielectric material; and
a driving device configured to move the slug, wherein the driving device includes a sliding member being inserted into the slug and sliding along the inside of the inner conductor while being brought into contact with an inner circumference surface of the inner conductor, the sliding member having a screw hole, and
wherein the heat dissipation device has:
a heat pipe, having a heat input end and a heat dissipation end, configured to transfer the heat of the antenna unit from the heat input end to the heat dissipation end by disposing the heat input end in the antenna unit; and
a heat dissipation unit provided at the heat dissipation end of the heat pipe to dissipate the heat transferred to the heat dissipation end.

13. The microwave plasma source of claim 12, wherein the driving device includes:
a driving unit configured to supply a driving force;
a driving delivery unit configured to deliver the driving force supplied from the driving unit to the slug;
a driving guide unit configured to guide a movement of the slug; and
a supporting unit configured to support the slug in the driving delivery unit,
wherein the driving delivery unit, the driving guide unit and the supporting unit are accommodated inside the inner conductor.

14. The mechanism of claim 13, wherein, in the driving device, the driving delivery unit employs a screw mechanism including the sliding member and a slug moving shaft formed of a screw bar which is extended inside the inner conductor in a longitudinal direction thereof and is screwed into the screw hole of the sliding member; the driving guide unit serves as a sliding guide mechanism which is formed by the sliding member and the inner circumference surface of the inner conductor; the supporting unit is formed of the sliding member and the slug moving shaft; and the driving unit has a motor rotating the slug moving shaft, the driving unit rotating the slug moving shaft by using the motor to drive the slug in a state where the sliding member slides along the inner circumference surface of the inner conductor.

15. A plasma processing apparatus which performs a plasma process on a target substrate accommodated in a chamber, the apparatus comprising:
the chamber configured to accommodate the target substrate therein;
a gas supply mechanism configured to supply a gas into the chamber; and
a microwave plasma source configured to convert the gas supplied into the chamber to a plasma by introducing a microwave into the chamber, the microwave plasma source including:
a microwave generating mechanism configured to generate a microwave;
a microwave transmission line through which the generated microwave is transmitted; and
a microwave introducing mechanism provided in the microwave transmission line to introduce the transmitted microwave into the chamber, wherein the microwave introducing mechanism includes:
an antenna unit including a planar antenna configured to radiate the microwave into the chamber through the microwave transmission line;
a tuner provided in the microwave transmission line to adjust an impedance of the microwave transmission line; and
a heat dissipation device configured to dissipate a heat from the antenna unit,
wherein the tuner has:
a tuner main body including a tubular outer conductor and a tubular inner conductor coaxially provided in the outer conductor, the tuner main body serving as a part of the microwave transmission line;
a slug provided between the outer conductor and the inner conductor to be movable along a longitudinal direction of the inner conductor, the slug having an annular shape and being made of a dielectric material; and
a driving device configured to move the slug, wherein the driving device includes a sliding member being inserted into the slug and sliding along the inside of the inner conductor while being brought into contact with an inner circumference surface of the inner conductor, the sliding member having a screw hole, and
wherein the heat dissipation device has:
a heat pipe, having a heat input end and a heat dissipation end, configured to transfer the heat out of the antenna unit from the heat input end to the heat dissipation end by disposing the heat input end in the antenna unit; and
a heat dissipation unit provided at the heat dissipation end of the heat pipe to dissipate the heat transferred to the heat dissipation end.

16. The plasma processing apparatus of claim 13, wherein the driving device includes:
a driving unit configured to supply a driving force;
a driving delivery unit configured to deliver the driving force supplied from the driving unit to the slug;
a driving guide unit configured to guide a movement of the slug; and
a supporting unit configured to support the slug in the driving delivery unit,
wherein the driving delivery unit, the driving guide unit and the supporting unit are accommodated inside the inner conductor.

17. The plasma processing apparatus of claim 16, wherein, in the driving device, the driving delivery unit employs a screw mechanism including the sliding member and a slug moving shaft formed of a screw bar which is extended inside the inner conductor in a longitudinal direction thereof and is screwed into the screw hole of the sliding member; the driving guide unit serves as a sliding guide mechanism which is formed by the sliding member and the inner circumference surface of the inner conductor; the supporting unit is formed of the sliding member and the slug moving shaft; and the driving unit has a motor rotating the slug moving shaft, the driving unit rotating the slug moving shaft by using the motor to drive the slug in a state where the sliding member slides along the inner circumference surface of the inner conductor.

* * * * *